(12) United States Patent
Nikolayev et al.

(10) Patent No.: US 12,440,667 B2
(45) Date of Patent: Oct. 14, 2025

(54) METHOD FOR MANUFACTURING AN ELECTRODE

(71) Applicants: IMEC VZW, Leuven (BE); Universiteit Gent, Ghent (BE)

(72) Inventors: Denys Nikolayev, Lviv (UA); Wout Joseph, Vichte (BE); Luc Martens, De Pinte (BE); Alexandru Andrei, Wolluwe Saint Pierre (BE); Carolina Mora Lopez, Kessel-Lo (BE); Emmeric Tanghe, Ghent (BE)

(73) Assignees: IMEC VZW, Leuven (BE); Universiteit Gent, Ghent (BE)

( * ) Notice: Subject to any disclaimer, the term of this patent is extended or adjusted under 35 U.S.C. 154(b) by 407 days.

(21) Appl. No.: 18/068,045

(22) Filed: Dec. 19, 2022

(65) Prior Publication Data
US 2023/0201573 A1    Jun. 29, 2023

(30) Foreign Application Priority Data

Dec. 23, 2021    (EP) .................................... 21217497

(51) Int. Cl.
| | |
|---|---|
| A61N 1/05 | (2006.01) |
| H01B 5/14 | (2006.01) |
| H01B 13/00 | (2006.01) |

(52) U.S. Cl.
CPC ............. *A61N 1/0529* (2013.01); *H01B 5/14* (2013.01); *H01B 13/0036* (2013.01)

(58) Field of Classification Search
CPC .. A61N 1/0529; A61N 1/0534; A61N 1/0543; A61N 1/36046; A61N 1/3616;
(Continued)

(56) References Cited

U.S. PATENT DOCUMENTS

| | | | |
|---|---|---|---|
| 10,159,832 B2 | 12/2018 | Zhou et al. | |
| 2007/0112402 A1* | 5/2007 | Grill ...................... | A61N 1/375 607/115 |

(Continued)

FOREIGN PATENT DOCUMENTS

| | | |
|---|---|---|
| CN | 101623537 A | 1/2010 |
| CN | 112675423 A | 4/2021 |
| WO | 2021026662 A1 | 2/2021 |

OTHER PUBLICATIONS

Extended European Search Report and Written Opinion, Application No. EP 21217497.3, mailed Jun. 15, 2022, 7 pages.
(Continued)

*Primary Examiner* — Carl H Layno
*Assistant Examiner* — Anh-Khoa N Dinh
(74) *Attorney, Agent, or Firm* — McDonnell Boehnen Hulbert & Berghoff LLP

(57) ABSTRACT

A method includes providing a first electrically conductive element over a top surface of a substrate. The method includes measuring at least one parameter indicative of the shape or dimensions of the first electrically conductive element. The method includes simulating the first electrically conductive element and a dielectric wall surrounding the first electrically conductive element for a plurality of wall heights by using the at least one parameter as an input. The method includes for each wall height, computing the maximum current density present at a surface of the first electrically conductive element. The method includes determining, from the maximum current densities, wall height(s) for which the maximum current density is below a threshold. Furthermore, the method includes providing a second electrically conductive element, identical to the first electrically conductive element, surrounded by a wall having a wall height of the determined wall height(s).

20 Claims, 10 Drawing Sheets

(58) Field of Classification Search
CPC .............................. H01B 5/14; H01B 13/0036; A61B 2562/125; H10N 70/026; H10N 70/063; H10N 70/20; H10N 70/231; H10N 70/823; H10N 70/881; H10N 70/8828; H10N 70/8833; H10N 70/8836; H10N 70/041; H10N 70/884
See application file for complete search history.

(56) References Cited

U.S. PATENT DOCUMENTS

| | | |
|---|---|---|
| 2019/0030318 A1 | 1/2019 | Lee et al. |
| 2020/0087810 A1 | 3/2020 | Hosseini et al. |
| 2021/0085961 A1 | 3/2021 | Ferro et al. |
| 2021/0102304 A1 | 4/2021 | Zeng et al. |

OTHER PUBLICATIONS

Nikolayev, Denys, Wout Joseph, Emmeric Tanghe, Marleen Welkenhuysen, Carolina Mora Lopez, Thomas Tarnaud, and Luc Martens. "Proceedings # 63: Low-Profile 3D Microelectrodes with Near-Uniform Current Density for High-Resolution Neural Stimulation." Brain Stimulation: Basic, Translational, and Clinical Research in Neuromodulation 12, No. 4 (2019): e155-e157.

Seo, Hee Won, Namju Kim, and Sohee Kim. "Fabrication of subretinal 3D microelectrodes with hexagonal arrangement." Micromachines 11, No. 5 (2020): 467, 12 pages.

Zia, Muneeb, Bryce Chung, Samuel J. Sober, and Muhannad S. Bakir. "Fabrication and characterization of 3D multi-electrode array on flexible substrate for in vivo EMG recording from expiratory muscle of songbird." In 2018 IEEE International Electron Devices Meeting (IEDM), pp. 29-4.1 to 29-4.4. IEEE, 2018.

Guimont, Joe, and Babak Ziaie. "A batch-manufacturable uniform current density metallic-shell hemispherical microelectrode." In The 26th Annual International Conference of the IEEE Engineering in Medicine and Biology Society, vol. 2, pp. 4149-4152. IEEE, 2004.

Guo, Liang, and Stephen P. DeWeerth. "PDMS-based conformable microelectrode arrays with selectable novel 3-D microelectrode geometries for surface stimulation and recording." In 2009 Annual International Conference of the IEEE Engineering in Medicine and Biology Society, pp. 1623-1626. IEEE, 2009.

Radhakrishnan, Shruthi, Kyle Ondar, Aakhila Rameeza, and Xuefeng Wei. "Novel Recessed Electrode Geometries to Minimize Tissue Damage with Directional Selectivity in Deep Brain Stimulation." In 2020 42nd Annual International Conference of the IEEE Engineering in Medicine & Biology Society (EMBC), pp. 3634-3637. IEEE, 2020.

Sun, Xiaona, Gang Li, Zhuanghui Zhu, Hongbo Zhou, and Jianlong Zhao. "Fabrication of dome-shaped flexible electrode arrays for retinal prostheses." In 2010 IEEE 5th International Conference on Nano/Micro Engineered and Molecular Systems, pp. 48-51. IEEE, 2010.

* cited by examiner

METHOD FOR MANUFACTURING AN ELECTRODE

CROSS-REFERENCE TO RELATED APPLICATIONS

The present application is a non-provisional patent application claiming priority to European patent application number 21217497.3, filed Dec. 23, 2021, the contents of which are hereby incorporated by reference.

FIELD OF THE DISCLOSURE

The present disclosure relates to the field of electrode fabrication, and more in particular to the fabrication of microelectrodes.

BACKGROUND

Deep brain stimulation (DBS) is a technique used to treat neural disorders such as Parkinson's disease, tremor, and dystonia. A DBS system comprises tiny microelectrodes that are implanted in the brain to deliver stimulation pulses to the tissue, and an electrical pulse generator that generates the stimulation pulses and is connected to the electrodes.

Using electrodes to stimulate a live brain entails safety risks. In particular, a localized current of too high an intensity can cause damages to the brain tissues and/or to the electrode itself. For instance, this can cause corrosion of the electrode and undesired ions to enter the brain. Current density should therefore remain under a certain safety threshold. However, intensity should be high enough for the electrode to fulfil its function. It is, therefore, particularly undesirable for such electrodes to have a very uneven current density profile across their surface. Indeed, this can translate in some area of the electrode not delivering enough current and some other area delivering too much of it. The edges of the electrode can be problematic in this respect. It has been shown that the current density in planar electrodes is not uniform and is higher around the perimeter. Hence, for a given total current, a current density profile as flat as possible is desired. Injected charge is the time integral of the current, thus the main benefit of providing a current density as uniform as possible is that it is possible to achieve a higher safe injected charge.

In theory, electrode shapes are known that can fulfil this need. In particular, a perfect sphere, a perfect half sphere above an infinite insulator, or a perfect disc infinitely recessed into an insulator should have a flat current density profile. In practice, however, an infinite insulator cannot be produced and a perfect sphere, a perfect half sphere, or a perfect disc cannot be achieved. Also, an electrode supported by a very large insulator could anyway not be used. Also, an infinitively deep insulating well cannot be produced, and an electrode buried that way could anyway not be used.

Furthermore, the fabrication process should be easily scalable to mass manufacturing levels. Ideally, the fabrication should be compatible with CMOS processes.

There is therefore a need in the art for new manufacturing methods overcoming at least partially one or more of these issues.

SUMMARY

The present disclosure pertains to providing one or more electrodes and methods for manufacturing the one or more electrodes.

The present disclosure provides example embodiments in the form of a method or a device.

In a first aspect, the present disclosure provides a method for manufacturing an electrode. The method includes providing a first electrically conductive element over a top surface of a substrate. The method also includes measuring at least one parameter indicative of the shape or of the dimensions of the first electrically conductive element. Additionally, the method includes simulating the first electrically conductive element and a dielectric wall surrounding the first electrically conductive element for a plurality of wall heights by using the at least one parameter as an input. Further, the method includes, for each wall height, computing a maximum current density present at a surface of the first electrically conductive element. Furthermore, the method includes determining, based on the maximum current densities, one or more wall heights for which the maximum current density is below a predefined threshold. Furthermore still, the method includes providing a second electrically conductive element, identical to the first electrically conductive element, surrounded by a corresponding wall having a corresponding wall height of the one or more wall heights.

In a second aspect, the present disclosure relates to an electrode obtainable by a method according to any embodiment of the first aspect. The electrode can comprise a first electrically conductive element on a substrate (e.g., over a top surface of the substrate). The first electrically conductive element can be surrounded by a wall which has a wall height smaller than 0.1038 times the length (or diameter) of the first electrically conductive element. The wall height (h) can be measured from a bottom surface of the first electrically conductive element to a top surface of the wall. In at least some embodiments, the wall height smaller than 0.1000 times the length (or diameter) of the first electrically conductive element.

In a third aspect, the present disclosure relates to a brain stimulation system comprising an electrode according to any embodiment of the second aspect, and an electrical pulse generator electrically coupled to the electrode.

In a fourth aspect, the present disclosure relates to an array of electrodes according to any embodiment of the second aspect. The array of electrodes can include electrodes arranged like an electrode 3 shown in the drawings.

In a fifth aspect, the present disclosure relates to a neural probe comprising the array of electrodes according to any embodiment of the fourth aspect.

At least some of the example embodiments, the embodiments are of CMOS compatible and, hence, scalable.

At least some of the example embodiments can include a standard processing step without requiring complex or expensive techniques.

At least some of the example embodiments arranged as a method allow for the production of electrodes having a corresponding current density profile in spite of various electrode shapes (e.g., an imperfect shape, such as an imperfect sphere, imperfect half sphere, or imperfect disc).

At least some of the example embodiments can include the use of the electrodes to improve a current density profile in a tailor-made fashion.

At least some of the example embodiments can allow for making electrodes with a high safe injected charge.

At least some of the example embodiments can improve the ability to provide direct brain stimulation (DBS) and/or to make DBS safer, more precise, and/or more affordable.

At least some of the example embodiments can include the fabrication of electrodes with a corresponding current density profile while simultaneously comprising a surrounding wall having a height that is smaller than 0.1038 times the length (or diameter) of the electrically conductive element. In at least some other embodiments, the surrounding wall has a height that is smaller than 0.1000 times the length (or diameter) of the electrically conductive element. Accordingly, in at least some embodiments, walls can be fabricated that do not hamper the use of the electrode.

Example embodiments are set out in the accompanying independent and dependent claims. Features from the dependent claims can be combined with features of the independent claims and with features of other dependent claims as appropriate and not merely as explicitly set out in the claims.

Although there has been improvement, change, and evolution of methods to produce devices in this field, the present disclosure is believed to represent substantial new improvements, including departures from prior practices. One or more example embodiments can pertain to the provision of more efficient, safe, stable, and/or reliable devices of this nature.

The above and other characteristics, features and advantages of the present invention will become apparent from the following detailed description, taken in conjunction with the accompanying drawings, which illustrate, by way of example, the principles described in the disclosure. This description is given for the sake of example only, without limiting the scope of the claims. The reference figures quoted below refer to the attached drawings.

BRIEF DESCRIPTION OF THE FIGURES

The above, as well as additional, features will be better understood through the following illustrative and non-limiting detailed description of example embodiments, with reference to the appended drawings.

Figure 1:
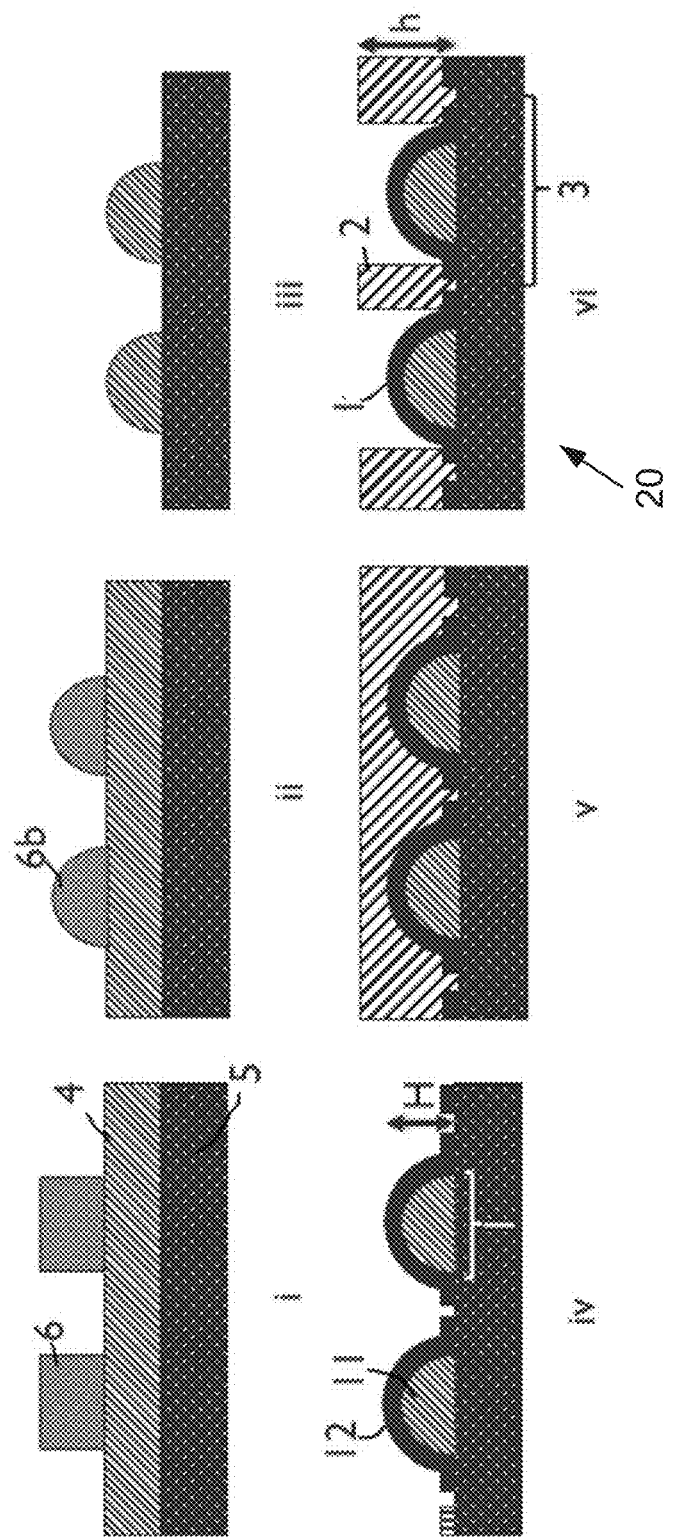
FIG. 1 is a schematic representation of a process for forming electrodes in accordance with the example embodiments.

In the different figures, the same reference signs refer to the same or analogous elements.

All the figures are schematic, not necessarily to scale, and generally only show parts which are necessary to elucidate example embodiments, wherein other parts can be omitted or merely suggested.

DETAILED DESCRIPTION

Example embodiments will now be described more fully hereinafter with reference to the accompanying drawings. That which is encompassed by the claims can, however, be embodied in many different forms and should not be construed as limited to the embodiments set forth herein; rather, these embodiments are provided by way of example. Furthermore, like numbers refer to the same or similar elements or components throughout.

The present disclosure describes example embodiments, at least some with reference to certain drawing(s). The drawings are schematic and are non-limiting. In the drawings, the size of some element(s) can be exaggerated and not drawn on scale for illustrative purposes. The dimensions and the relative dimensions, if any, are for example only.

The terms first, second, third, and the like in the description and/or in the claims are used for distinguishing between similar elements and not necessarily for describing a sequence, either temporally, spatially, in ranking or in any other manner. It is to be understood that the terms so used are interchangeable under appropriate circumstances and that the example embodiments are capable of operation in other sequence(s) than described or illustrated herein.

The terms top, bottom, over, under and the like in the description and/or the claims are used for descriptive purposes and not necessarily for describing relative positions. It is to be understood that the terms so used are interchangeable under appropriate circumstances and that the example embodiments are capable of operation and/or can be arranged in other orientations than described or illustrated herein.

The terms "comprising," "comprises," and "comprise" used in the description and/or the claims should not be interpreted as being restricted to the means and/or structure listed thereafter, and those terms do not exclude other elements and/or functions. It is thus to be interpreted as specifying the presence of the stated features, integers, steps, functions, or components as referred to, but does not preclude the presence or addition of one or more other features, integers, steps, functions and/or components, or groups thereof. The terms "comprising," "comprises," and "comprise" therefore cover a situation where only the stated feature(s) are present (and can therefore always be replaced by "consisting of" in order to restrict the scope to the stated features) and the situation where these features and one or more other features are present. The terms "comprising," "comprises," and "comprise" therefore are for embodiments in which no further components are present. Thus, the scope of the expression "a device comprising A and B" should not be interpreted as being limited to devices consisting only of components A and B, but rather the relevant components for that embodiment of the device are A and B.

Reference throughout this disclosure to "one embodiment" or "an embodiment" means that a particular feature, structure, or characteristic described in connection with the embodiment is included in at least one embodiment. Thus, appearances of the phrases "in one embodiment" or "in an embodiment" in various places throughout this specification are not necessarily all referring to the same embodiment, but can. Furthermore, the particular features, structures, or characteristics can be combined in any suitable manner, as would be apparent to one of ordinary skill in the art from this disclosure, in one or more embodiments.

Similarly, it should be appreciated that in the description of example embodiments, various features are sometimes grouped together in a single embodiment, figure, or description thereof for the purpose of streamlining the disclosure and aiding in the understanding of one or more of the example embodiments. This disclosure, however, is not to be interpreted as reflecting an intention that any example embodiment(s) requires more features than are expressly recited in each claim. Accordingly, some claims can include less than all features of a single foregoing disclosed embodiment. The claims following the detailed description are hereby expressly incorporated into this detailed description, with each claim standing on its own as a separate example embodiment.

While some embodiments described herein include some but not other features included in other embodiments, combinations of features of different embodiments are meant to be within the scope of the disclosure, and form different embodiments, as would be understood by those having ordinary skill in the art. For example, in the claims following the detailed description, any of the claimed embodiments can be used in any combination.

Some of the embodiments are described herein as a method or combination of elements of a method and can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element. The aforementioned instructions can include computer-readable instructions stored in a non-transitory computer-readable memory.

In this description, numerous specific details are set forth. However, one or more of the example embodiments can be practiced without one or more of the specific details. In other instances, well-known methods, structures and techniques have not been shown in detail in order not to obscure an understanding of this description.

The disclosure now provides a detailed description of several example embodiments. It is clear that other example embodiments can be configured according to the knowledge of persons having ordinary skill in the art without departing from the technical teaching of the disclosure.

Figure 3:
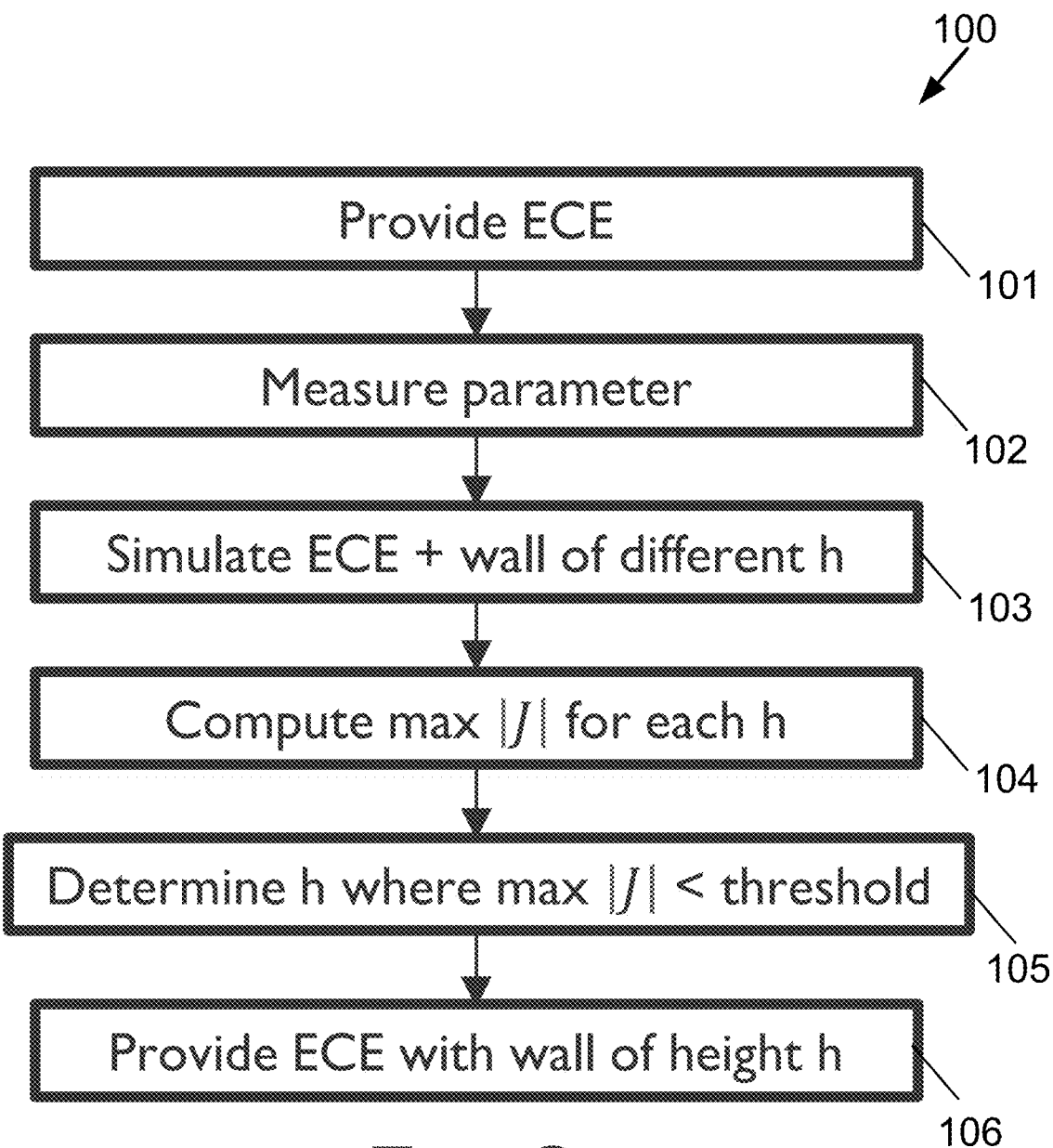
FIG. 3 is a flow chart corresponding to the first aspect in accordance with the example embodiments.

Turning to FIG. 3, a flow chart including a set of functions 100 in accordance with one or more example embodiments is shown.

In the first aspect, the example embodiments relate to a method for manufacturing an electrode, such as the electrode 3. The method includes one or more or all of the functions shown in a Block 101 to a Block 106.

Block 101 includes providing an electrically conductive element (ECE) 1 over a top surface of a substrate 5.

Next, Block 102 includes measuring at least one parameter indicative of the shape or of the dimensions of the electrically conductive element 1.

Next, Block 103 includes simulating the electrically conductive element 1 and a dielectric wall 2 surrounding the same for a plurality of wall heights (h) by using the at least one parameter as an input, Next, Block 104 includes, for each wall height (h), computing the maximum current density |J| present at a surface of the electrically conductive element 1.

Next, Block 105 includes determining, from the maximum current densities |J| computed at Block 104, one or more wall heights (h) for which the maximum current density |J| is below a predefined threshold.

Next, Block 106 includes providing an electrically conductive element 1, identical to the electrically conductive element 1 provided in Block 101, surrounded by a wall 2 having a wall height (h) as determined in Block 105.

In at least some embodiments, the functions shown in Block 101 to Block 106 can be performed in an order as shown in FIG. 3.

In at least some embodiments, the function of Block 105 can include identifying among the one or more wall heights (h) for which the maximum current density is below a predefined threshold, the wall height (h) giving rise to the lowest maximum current density. Moreover, the function of Block 106 can include providing an electrically conductive element 1, identical to the electrically conductive element 1 provided at Block 101, surrounded by a wall 2 having a wall height (h) closer to the wall height identified at Block 105 than to any other wall heights (h) among the one or more wall heights (h).

In at least some embodiments, the wall 2 surrounding the electrically conductive element 1 provided at Block 106 can have a wall height (h) within 10% of a wall height (h) giving rise to the lowest maximum current density.

In at least some embodiments, the electrode 3 can be used in brain stimulation, e.g., deep brain stimulation, or for use in in vitro cell tissue stimulation. Additionally or alternatively, in at least some embodiments, the fabrication of electrodes can be for used in batteries or galvanic cells.

In at least some embodiments, the shape of the electrically conductive element 1 is not critical for the example methods. As such, the example methods can be adapted to any shape. Even so, some shapes have a flatter current density profile than others. Therefore, at least some of the embodiments can include and/or result in an electrically conductive element with a shape having the flatter current density profile than others.

In at least some embodiments, a top surface of the electrically conductive element 1 provided at Block 101 can have a at least a section having concave shape with a concavity facing the substrate 5. For instance, a shape for the electrically conductive element 1 can be a dome, i.e., a spheroid cap. As an example, the spheroid cap can include and/or be arranged as a spherical cap, a half spheroid, and/or a half-sphere.

In at least some embodiments, a top surface of the electrically conductive element 1 provided at Block 101 can be flat while side walls of the electrically conductive element 1 can have a concave shape with a concavity facing the substrate 5.

For instance, the electrically conductive element 1 can have the shape of a spheroid segment, such as a spherical segment.

In at least some example embodiments, a geometrical center of a top surface of the electrically conductive element 1 can be higher than any edge of the top surface of the electrically conductive element 1.

In at least some example embodiments, the height to width ratio of the electrically conductive element 1 is 1.0 or lower. In some other embodiments, the height to width ratio is 0.5 or lower. The height is measured perpendicular to the substrate and the width is the smallest dimension measured parallel to the substrate.

In at least some embodiments, the electrically conductive element 1 provided at Block 101 can have a length (or diameter) measured parallel to the top surface of the substrate 5 which is larger than a height measured perpendicular to the top surface of the substrate 5.

In at least some embodiments, the electrically conductive element 1 provided at Block 101 can have a length (or diameter) measured parallel to the top surface of the substrate 5 which measures from 10 μm to 200 μm. In at least some other embodiments, the length (or diameter) measured parallel to the top surface of the substrate 5 can measure from 25 μm to 150 μm. In at least some other embodiments, the length (or diameter) measured parallel to the top surface of the substrate 5 can measure 25 μm to 90 μm.

In at least some embodiments, the electrically conductive element 1 provided at Block 101 can have a height (H) measured perpendicular to the substrate equal to from 1 μm to 10 μm.

In at least some embodiments, fabricating an electrically conductive element 1 at Block 101 having a dome shape can be performed by first forming on the substrate 5 an electrically conductive element 1 having a different initial shape, e.g., a cylinder or a polyhedron such as a rectangle or a cube. This electrically conductive element 1 is, in this case, a solid homogeneous element (i.e., not a core-shell structure). Second, the electrically conductive element 1 can be heated up, thereby inducing the reflow of the initial shape, thereby forming a dome shaped conductive element. The temperature necessary for the reflow can be very high.

In at least some embodiments, the electrically conductive element 1 can be made of one or more electrically conductive materials. In at least some embodiments, the electrically conductive element 1 can be made of a non-electrically conductive core 11 and a conductive shell 12.

Figure 2:
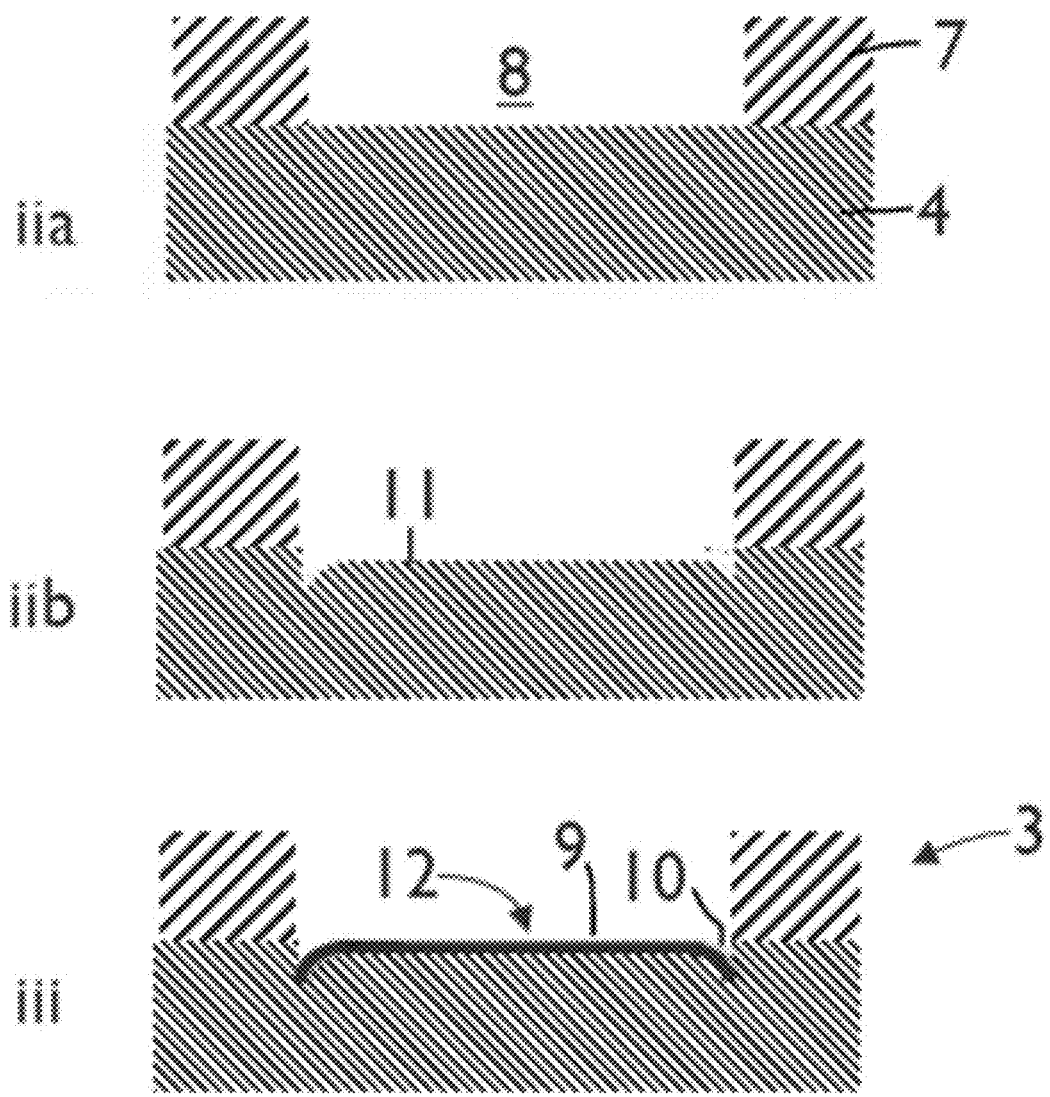
FIG. 2 is a schematic representation of a process for forming electrodes in accordance with the example embodiments.

In at least some embodiments, a core-shell electrically conductive element 1 can be formed. Examples are depicted in FIG. 1 and FIG. 2.

In at least some embodiments, the electrically conductive element 1 provided at Block 101 can comprise a non-conductive core 11 in physical contact with the substrate 5 and projecting therefrom, and an electrically conductive layer 12 plating a top surface of the non-conductive core 11.

Figure 4:
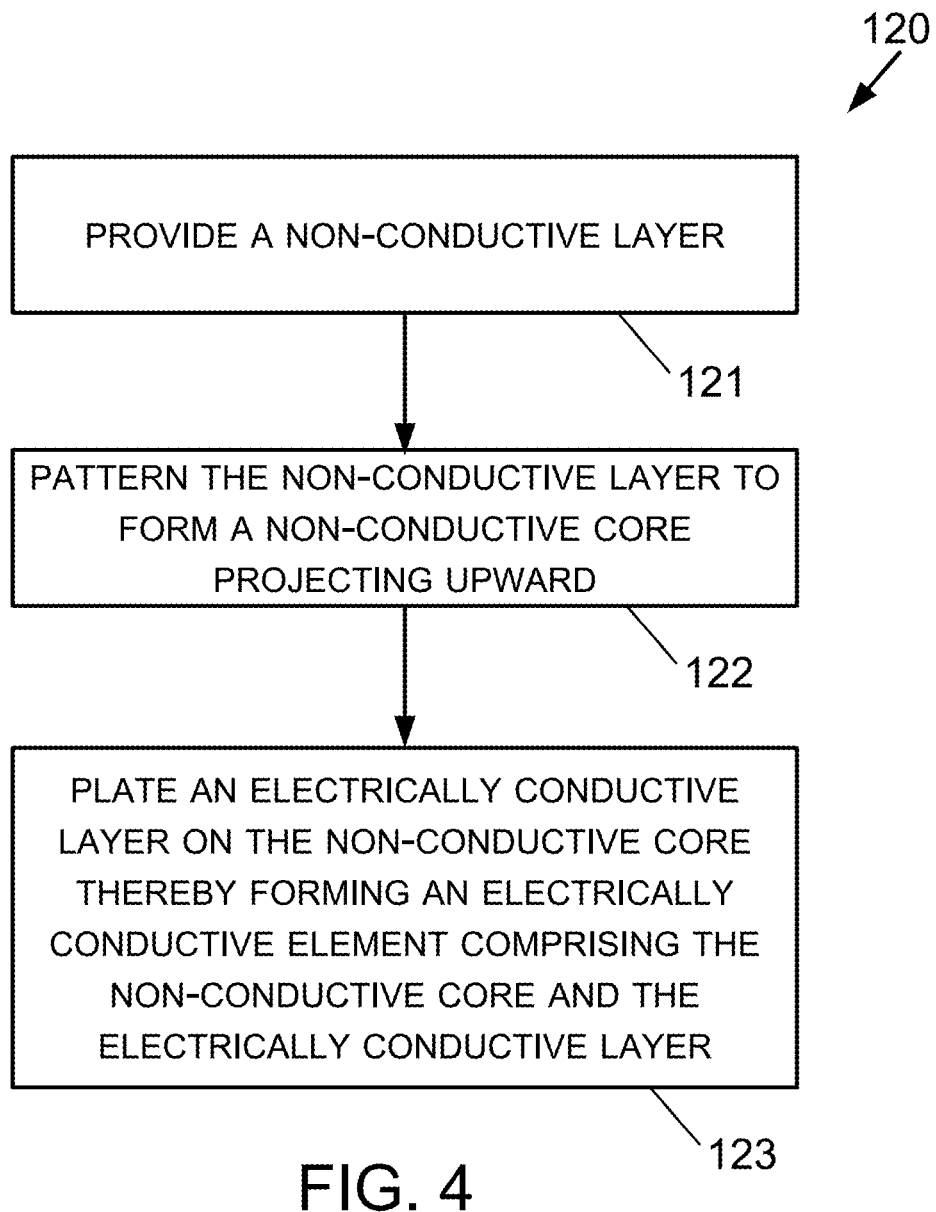
FIG. 4, FIG. 5, FIG. 6, FIG. 7, FIG. 8, and FIG. 9 show flow charts that indicate functions that can be performed in accordance with the example embodiments.

In at least some example embodiments, the function(s) at Block 101 shown in FIG. 3 can include one or more functions shown in FIG. 4.

Turning to FIG. 4, a flow chart including a set of functions 120 is shown. The functions are shown in a Block 121 to a Block 123.

Block 121 includes providing a non-conductive layer 4.

Next, Block 122 includes patterning the non-conductive layer 4 to form a non-conductive core 11 projecting upward.

Next, Block 123 includes plating an electrically conductive layer 12 on the non-conductive core 11, thereby forming an electrically conductive element 1 comprising the non-conductive core 11 and the electrically conductive layer 12.

By non-conductive layer 4, it is meant a layer which is not electrically conductive.

For instance, the substrate 5 shown in FIG. 1 can be the non-conductive layer 4. In other embodiments, the non-conductive layer 4 can be over a substrate. In such a case, the non-conductive layer 4 can include a dielectric layer 4 such as a $SiO_2$ layer or an $Si_3N_4$ layer.

In accordance with at least some embodiments, the non-conductive layer 4 can withstand at least 100° C. without losing its physical integrity. In accordance with at least some other embodiments, the non-conductive layer 4 can withstand at least 150° C. without losing its physical integrity. Accordingly, the use of techniques such as electrodeposition can be used in connection with the function(s) of Block 103.

Figure 5:
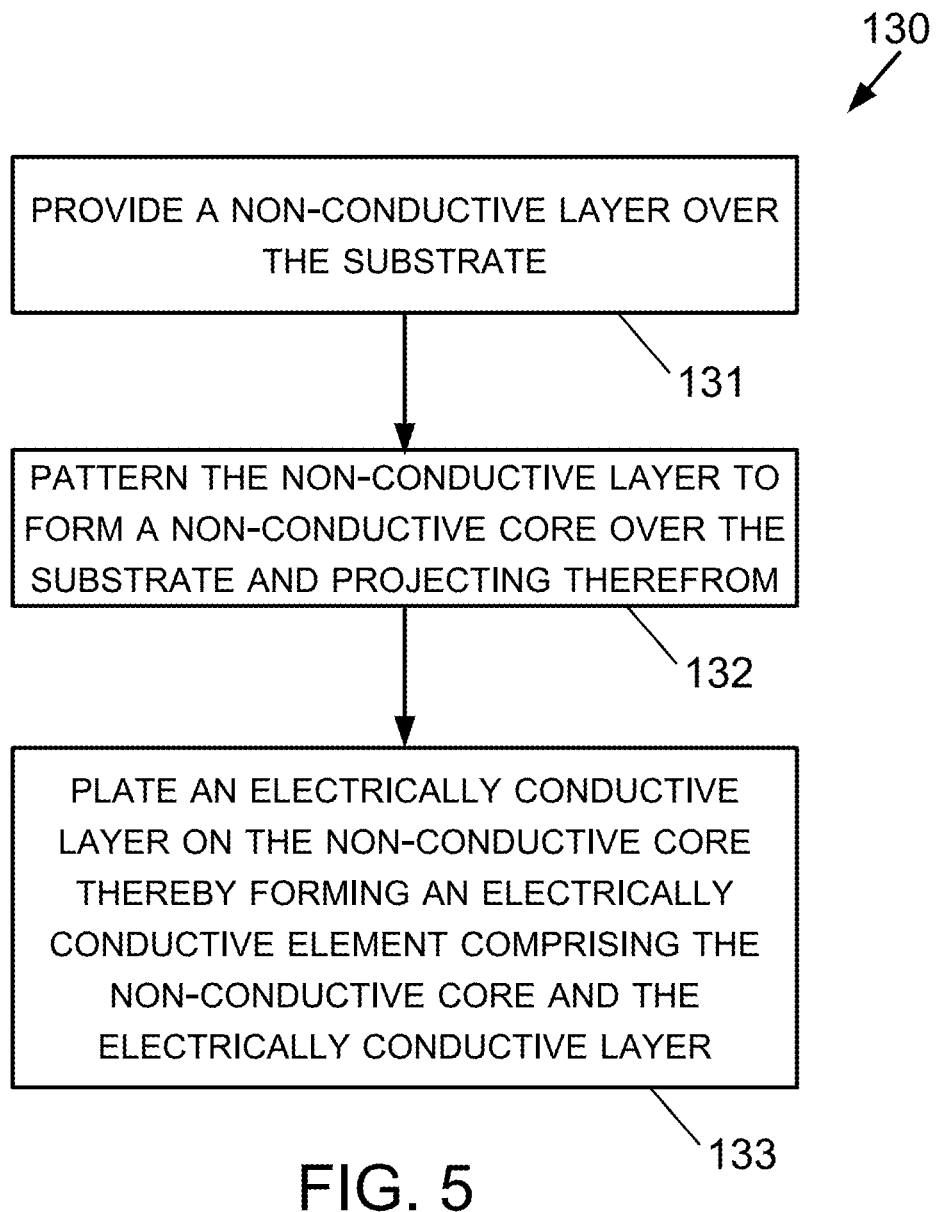

In at least some embodiments, the function(s) at Block 101 shown in FIG. 3 can include one or more functions shown in FIG. 5.

Turning to FIG. 5, a flow chart including a set of functions 130 is shown. The functions are shown in a Block 131 to a Block 133.

Block 131 includes providing a non-conductive layer 4 over the substrate 5.

Block 132 includes patterning the non-conductive layer 4 to form a non-conductive core 11 over the substrate 5 and projecting therefrom.

Block 133 includes plating an electrically conductive layer 12 on the non-conductive core 11, thereby forming an electrically conductive element 1 comprising the non-conductive core 11 and the electrically conductive layer 12.

Figure 6:
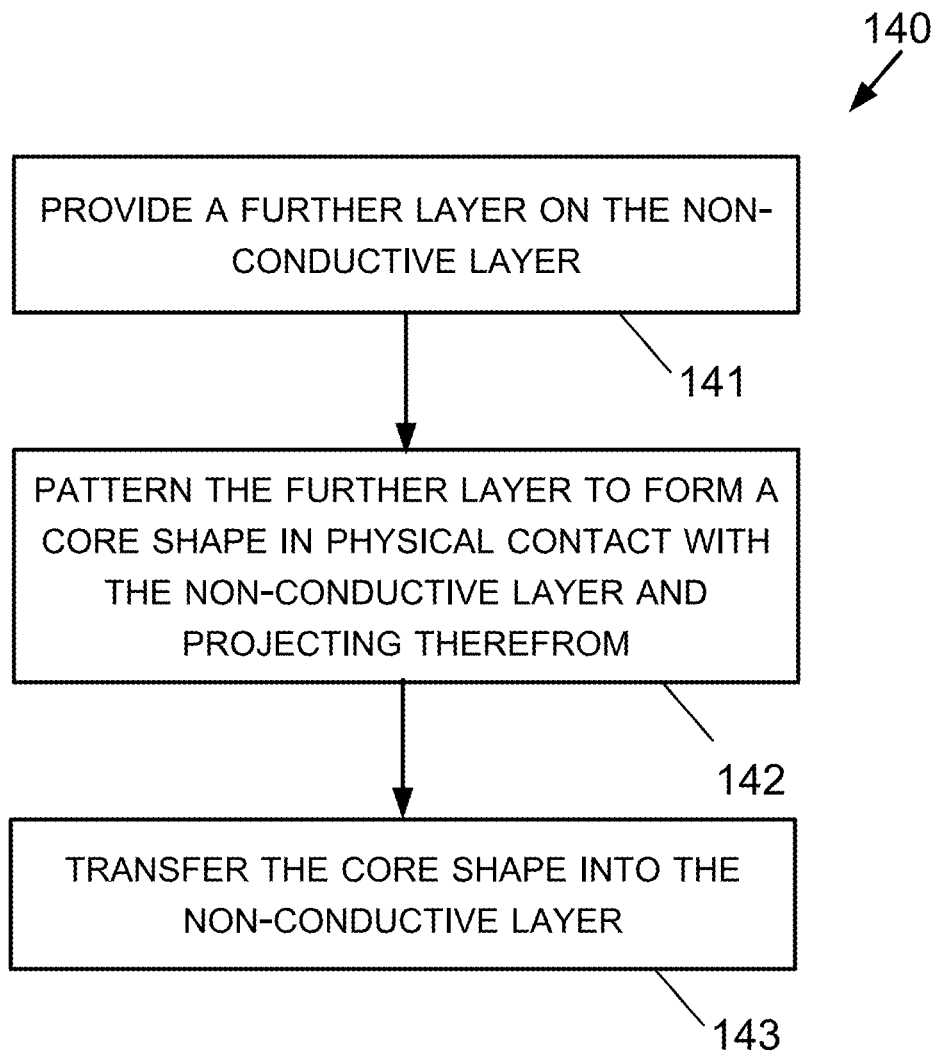

In at least some embodiments, the function(s) at Block 132 shown in FIG. 5 can include one or more functions shown in FIG. 6.

Turning to FIG. 6, a flow chart including a set of functions 140 is shown. The functions are shown in a Block 141 to a Block 143.

Block 141 includes providing a further layer on the non-conductive layer 4.

Next, Block 142 includes patterning the further layer to form a core shape 6b in physical contact with the non-conductive layer 4 and projecting therefrom.

Next, Block 143 includes transferring the core shape 6b into the non-conductive layer 4.

Figure 7:
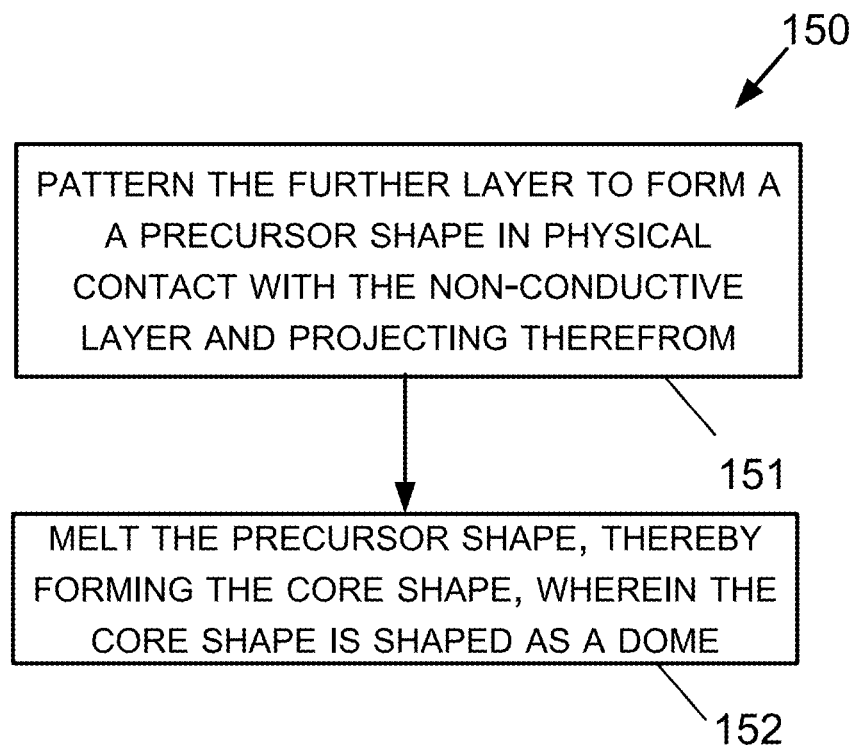

In at least some embodiments, the function(s) at Block 142 shown in FIG. 6 can include one or more functions shown in FIG. 7.

Turning to FIG. 7, a flow chart including a set of functions 150 is shown. The functions are shown in a Block 151 to a Block 152.

Block 151 includes patterning the further layer to form a precursor shape 6 in physical contact with the non-conductive layer 4 and projecting therefrom.

Next, Block 152 includes melting the precursor shape 6, thereby forming the core shape 6b, wherein the core shape 6b is shaped as a dome.

In at least some embodiments, the further layer can be a photoresist.

In at least some embodiments, the precursor shape 6 can be any shape. For instance, it can be a cylinder, or a polyhedron such as a rectangle or a cube.

In at least some embodiments, the functions at Block 143 can be performed by a dry etching process, such as reactive ion etching. Moreover, the functions at Block 143 can be performed until the further layer is fully etched, thereby entirely transferring its shape into the non-conductive layer 4.

In at least some embodiments, the material forming the non-conductive layer 4 can have an etching rate with respect to the performed etching which is within 10% of the photoresist material forming the photoresist element 6. In at least some other embodiments, the material forming the non-conductive layer 4 can have an etching rate with respect to the performed etching which is within 5% of the photoresist material forming the photoresist element 6. In at least still other embodiments, the material forming the non-conductive layer 4 can have an etching rate with respect to the performed etching which is the same as the etching rate of the photoresist material forming the photoresist element 6.

In at least some embodiments, the shape of the photoresist element 6 can be transferred to the non-conductive layer 4 with high fidelity. If the material forming the non-conductive layer 4 has an etching rate which is different from the etching rate of the photoresist element 6, the transfer of the shape of the photoresist element 6 into the dielectric layer 4 can be accompanied by a distortion. Although it is possible to take this distortion into account to arrive at a desired shape for the etched non-conductive layer 11, it is easier to select materials for the photoresist element 6 and the dielectric layer 4 that have a similar etching rate.

In at least some embodiments, if the electrically conductive layer 12 is made of a metal, the function(s) at Block 133 can be performed by any suitable method such as chemical vapor deposition (CVD), physical vapor deposition (PVD), sputtering, or electrodeposition. If the electrically conductive layer 12 is made of a ceramic, for instance TiN, it can be deposited by any suitable method such as CVD, PVD, or sputtering.

Figure 8:
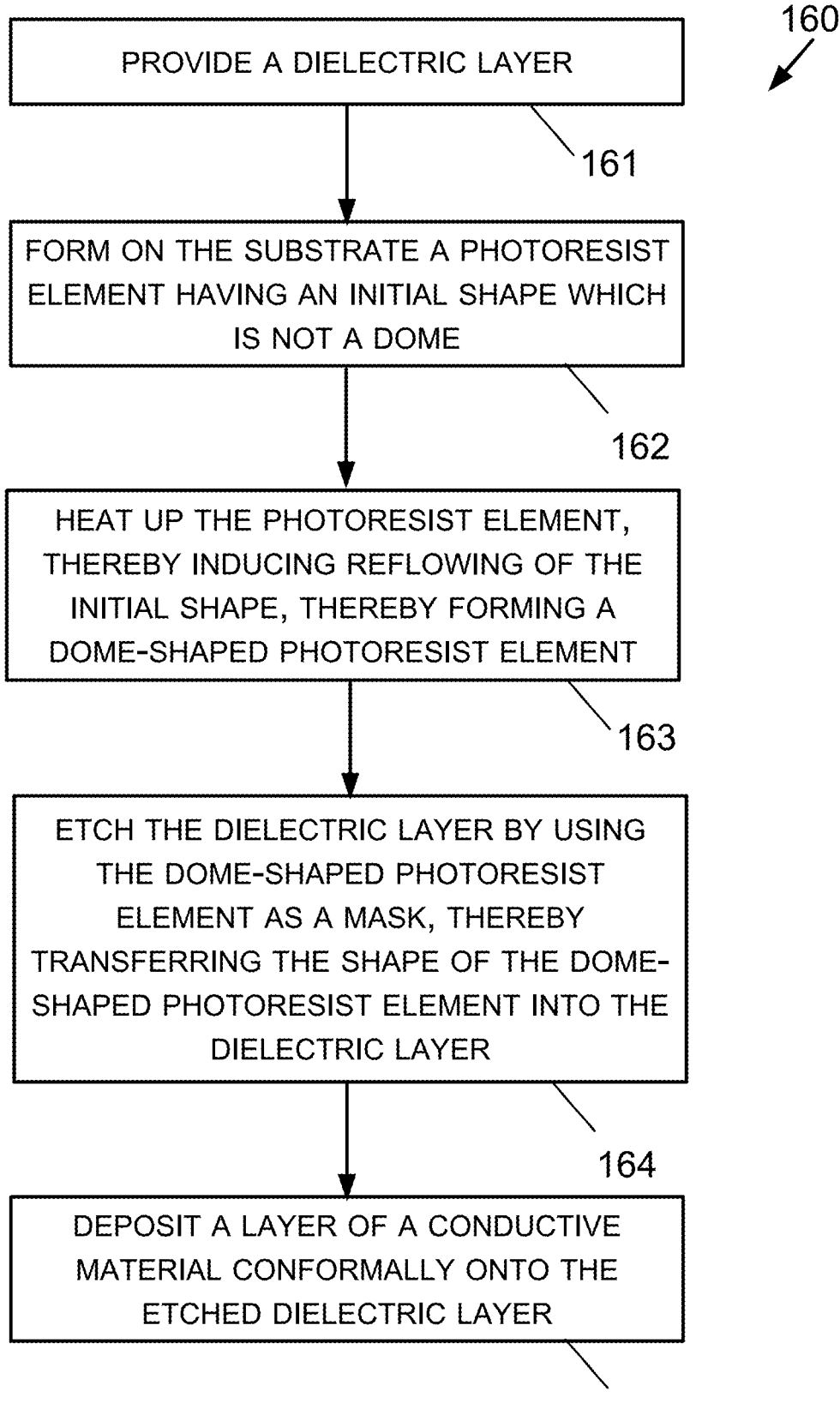

In at least some embodiments, such as an embodiment corresponding to aspects i, ii, iii, and iv in FIG. 1, fabricating an electrically conductive element 1 having a dome shape can be performed via functions shown in FIG. 8.

Turning to FIG. 8, a flow chart including a set of functions 160 is shown. The functions are shown in a Block 161 to a Block 165.

Block 161 includes providing a dielectric layer 4 (e.g., on a substrate 5).

Next, Block 162 includes forming (FIG. 1, aspect i) on the substrate 5 a photoresist element 6 having an initial shape which is not a dome, e.g., a cylinder, or a polyhedron such as a rectangle or a cube.

Next, Block 163 includes heating up (FIG. 1, aspect ii) the photoresist element 6, thereby inducing reflowing of the initial shape, thereby forming a dome-shaped photoresist element 6b.

Next, Block 164 includes etching (FIG. 1, aspect iii) the dielectric layer 4 by using the dome-shaped photoresist element 6b as a mask, thereby transferring the shape of the dome-shaped photoresist element 6b into the dielectric layer 4 (this step can, for instance, be performed by reactive ion etching).

Next, Block 165 includes depositing (FIG. 1, aspect iv) a layer of a conductive material conformally on the etched dielectric layer 4.

Next FIG. 2 shows aspects of example embodiments in the form of a method to form an electrode 3. In accordance with those embodiments, a top surface of an electrically conductive element (such as the electrically conductive element 1 provided in Block 101 shown in FIG. 1) is flat, while side walls of the electrically conductive element have a concave shape with a concavity facing downward. In accordance with these embodiments, dielectric walls 2 can be fabricated at the same time as the electrically conductive element 1.

In accordance with the example embodiments, the function(s) of Block 101 and/or Block 106 include one or more functions shown in FIG. 5.

Figure 9:
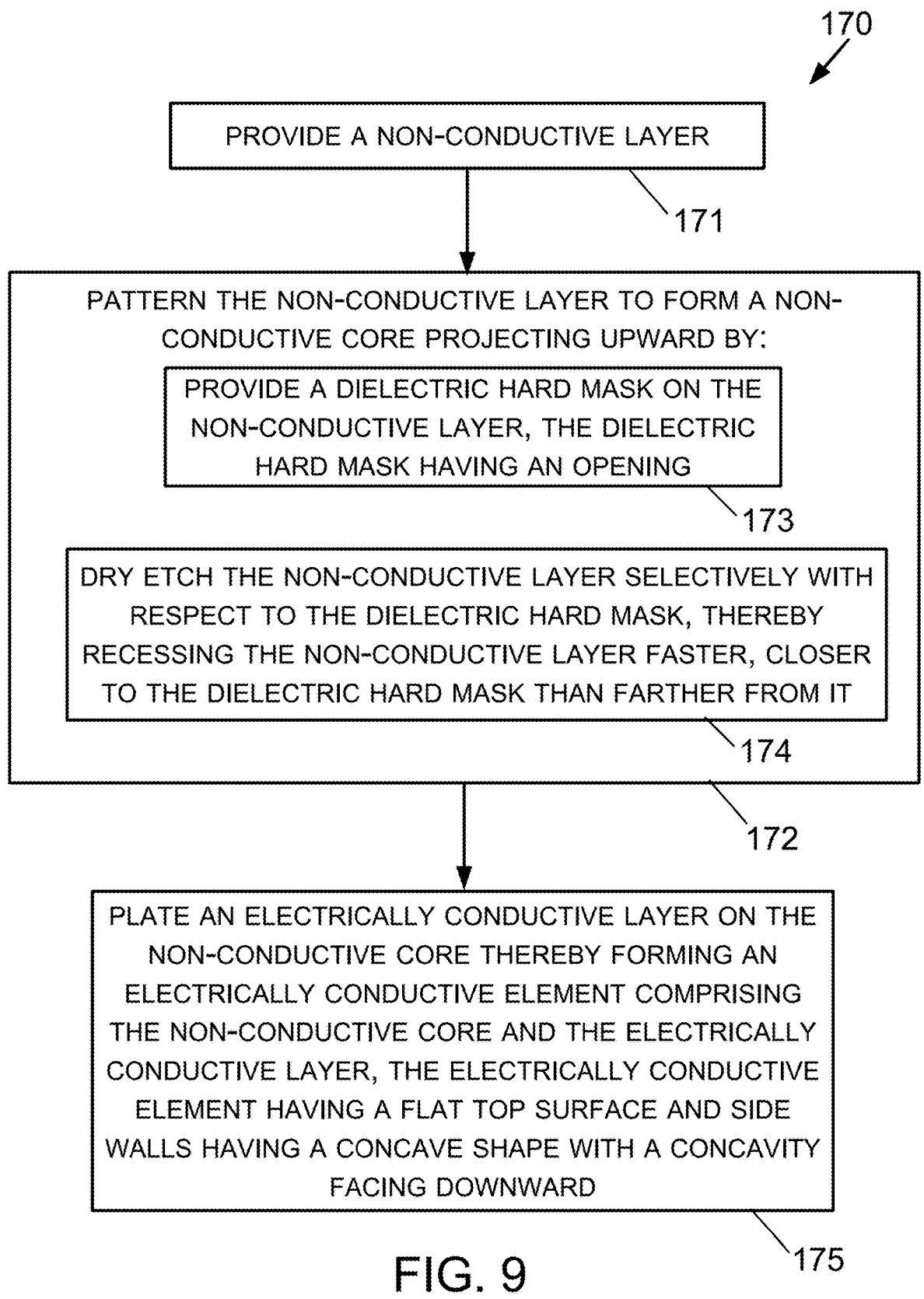

Turning to FIG. 9, a flow chart including a set of functions 170 is shown. The functions are shown in a Block 171 to a Block 175.

Block 171 includes providing a non-conductive layer 4.

Next, Block 172 includes patterning the non-conductive layer 4 to form a non-conductive core 11 projecting upward by the functions of a Block 173 and a Block 174.

Block 173 includes providing a dielectric hard mask 7 on the non-conductive layer 4, the dielectric hard mask 7 having an opening 8. See aspect iia in FIG. 2.

Block 174 includes dry etching the non-conductive layer 4 selectively with respect to the dielectric hard mask 7, thereby recessing the non-conductive layer 4 faster closer to the dielectric hard mask 7 than farther from it. See aspect iib in FIG. 2.

Next, Block 175 includes plating an electrically conductive layer 12 on the non-conductive core 11, thereby forming an electrically conductive element 1 comprising the non-conductive core 11 and the electrically conductive layer 12, the electrically conductive element 1 having a flat top surface 9 and side walls 10 having a concave shape with a concavity facing downward. See aspect iii in FIG. 2.

The etching in Block 174 can be faster closer to the dielectric hard mask 7, because the concentration in etching species can be larger there.

In at least some of the embodiments, the non-conductive layer 4 is etched at least 10 times faster than the dielectric hard mask 7.

In at least some embodiments, if performed at Block 101, a certain height of the dielectric hard mask is already present, forming a precursor to the walls 2. At Block 106, this height can be adapted by either removing a top portion of the dielectric hard mask 7 or by adding a portion to the top surface of the dielectric hard mask 7.

In accordance with at least some embodiments, the opening 8 is round.

In some embodiments, for instance embodiments depicted in FIG. 1, a plurality of electrically conductive elements 1 can be formed by replacing the non-conductive core 11 by a plurality of non-conductive core 11 at Block 101. This can, for instance, be achieved by replacing the precursor shape 6 at Block 101 by a plurality of precursor shapes 6. This way, after deposition of a layer of an electrically conductive material 12 conformally on the etched dielectric layer 11, a continuous electrically conductive layer 12 comprising a plurality of dome-shaped elements is produced. Next, the plurality of dome-shaped elements can be separated from one another, thereby forming the plurality of electrically conductive elements 1.

In at least some embodiments, the method can be directed to manufacturing an array 20 of electrodes 3. In accordance with these embodiments, the function(s) of Block 106 can comprise providing an array of electrically conductive elements 1. Each conductive element is identical to the electrically conductive element 1 provided at Block 101. Each conductive element is surrounded by a wall 2 having a wall height (h) as identified at Block 105.

In at least some embodiments, the substrate 5 can be a shank at least 3 times as long as it is wide. In at least some other embodiments, the substrate 5 can be a shank at least 10 times as long as it is wide. In at least some other embodiments, the substrate 5 can be a shank at least 50 times as long as it is wide. In at least some other embodiments, the substrate 5 can be a shank at least 140 times as long as it is wide.

As used herein, and unless provided otherwise, a shank is a straight object, or a straight part of an object, which is longer than it is wide. The length of the shank is its longest dimension, and it extends from one extremity of the shank to a second extremity. The shank has a flat surface running parallel to its length. The electrically conductive element can be on that flat surface.

In at least some embodiments, the width of the substrate (e.g., a shank) can be from 12 µm to 250 µm. In at least some other embodiments, the width of the substrate (e.g., a shank) can be from 50 µm to 125 µm. In at least some other embodiments, the width of the substrate (e.g., a shank) can be from 70 µm to 125 µm.

In at least some embodiments, the length (or diameter) of the electrode, measured parallel to the top surface of the substrate, can be from 40 to 70% of the width of the substrate (e.g. a shank).

The material of the substrate 5 can be a non-electrically conductive material, such as a dielectric material or an intrinsic semiconductor material (e.g., Si).

Example of parameters for Block 102 include the diameter, the height, and the curvature. In at least some embodiment, the diameter, the height, and the curvature are all measured.

The function(s) for Block 102 can be performed via a profilometry.

In at least some embodiments, the function(s) for Block 102 can be performed by scanning electron microscopy. These embodiment can have very high accuracy. Such embodiments can include preparing a cross-section of the electrically conductive element 1. This preparation could take additional time to perform. These embodiments can include the second embodiment for performing the function(s) at Block 106.

In at least some embodiments, the function(s) at Block 102 can be performed by a 3D optical profiler such as an interferometer. Such devices are available, for instance, from Bruker. Such devices can allow Block 102 to be performed in line (i.e., without having to cut into the electrically conductive element 1 provided in Block 101).

In at least some embodiments, in Block 103 and Block 106, the dielectric wall 2 is surrounding the electrically conductive element 1. The dielectric wall 2 can surround the electrically conductive element 1 on all lateral sides. The dielectric wall 2 can leave at least part of the top surface of the electrically conductive element 1 uncovered. This can be achieved by having both, the electrically conductive element 1 and the wall 2, on the substrate. In that case, the height of the wall 2 can for instance be measured from the top surface of the substrate or, equivalently, from the bottom surface of the electrically conductive element 1 with a same result. It can also be achieved by having the electrically conductive element 1 buried in the dielectric material forming the wall 2, the dielectric material forming a layer on the substrate 5. In this case, the height of the wall 2 can be the height of the dielectric material measured from the bottom surface of the electrically conductive element 1 to the top of the dielectric material forming the wall 2. Some embodiments can include measuring the wall height (h) from the bottom surface of the electrically conductive element 1 to the top of the dielectric material forming the wall 2. In at least some embodiments, the way the wall height is measured has, however, no impact on the method as long as it is measured in the same fashion in at both Block 103 and Block 106.

In at least some embodiments, in Block 103 and Block 106, the dielectric wall 2 can touch the electrically conductive element 1. The dielectric wall 2 can for instance be next to the electrically conductive element 1, and touch the electrically conductive element 1 without overlapping with it, or dielectric wall 2 can overlap with the electrically conductive element 1 while leaving a portion of its top surface uncovered.

In at least some embodiment, performing the function(s) at Block 103 can be done by any numerical simulation method known to a person having ordinary skill in the art. In at least some embodiments, performing the function(s) at Block 103 can be performed by an analytical method known to a person having ordinary skill in the art.

In at least some embodiment, the function(s) at Block 103 can be performed by a finite element method simulation. Examples of suitable software to perform the simulation are Comsol, Agrosdd, and CST.

As an example, the predefined threshold can depend on the materials used for the electrode and on the use of the electrode. In at least some embodiments, the predefined threshold can be 0.7 A cm$^{-2}$. In at least some other embodiments, the predefined threshold can be 0.6 A cm$^{-2}$. These embodiments can avoid tissue damage when the electrode is used for in vitro cell interfacing or for brain stimulation.

The disclosure now discusses two embodiments (i.e., a first embodiment and a second embodiment) with respect to performing the function(s) at Block 106. In the first embodiment, the function(s) at Block 106 are performed by surrounding the electrically conductive element 1 provided at Block 101 with a dielectric wall 2, by reducing the height of an existing wall 2 already surrounding the electrically conductive element 1 provided at Block 101, or by increasing the height of an existing wall 2 already surrounding the electrically conductive element 1 provided at Block 101.

Providing an electrically conductive element 1, identical to the electrically conductive element 1 provided at Block 101 can, therefore, mean either actually reusing the electrically conductive element 1 or providing a new electrically conductive element 1 which is identical to the electrically conductive element 1 provided at Block 101.

In at least some embodiments, the function(s) at Block 106 can be performed by repeating the function(s) at Block 101 anew (in the same conditions), and surrounding the newly formed electrically conductive element 1 with a dielectric wall 2. The first embodiment provides a wall 2 that is tailor-made for the actual electrically conductive element 1 that will form part of the electrode 3. The second embodiment provides that the functions of Block 102 to Block 105 do not have to be repeated for each produced electrode 3 since the function(s) at Block 106 can be repeated an indefinite number of times, each time with the same wall height (h) as determined, once and for all, at Block 105. This can increase throughput. Of course, in the second method, the wall height (h) is not tailor-made for the actual electrically conductive element 1 that will form part of the electrode 3. However, electrically conductive elements 1 produced in the same conditions are expected to be similar for a same wall height (h), as determined in the functions at Block 102 to Block 105, to be used for each electrically conductive element 1.

In at least some embodiments, the wall height (h) of the dielectric wall 2 surrounding the electrically conductive element 1 provided at the function(s) of Block 106 is measured from the bottom surface of the electrically conductive element 1 to a top surface of the wall 2 and is smaller than 0.1038 times the length (or diameter) of that electrically conductive element 1. In at least some other embodiments, the wall height (h) of the dielectric wall 2 surrounding the electrically conductive element 1 provided at the function(s) of Block 106 is smaller than 0.1000 times the length (or diameter) of that electrically conductive element 1. The length (or diameter) is measured parallel to the top surface of the substrate 5. In at least some embodiments, the dielectric wall 2 provided at Block 106 is from 0.1 µm to 3 µm high.

In at least some embodiments, the height of the electrode is relevant, but the width of the wall, measured parallel to the top surface of the wall, is not relevant as it does not impact the current density profile of the electrode 3.

In at least some embodiments, fabricating the dielectric wall 2 can be performed as follows (see FIG. 1 aspects v and vi). For example, the electrically conductive element 1 can be embedded in a planar dielectric layer (see FIG. 1, aspect v). The planar dielectric layer can be patterned to expose the top surface of the electrically conductive element 1, while leaving in place a part of the dielectric layer in physical contact with the edges of the electrically conductive element 1, thereby forming the dielectric wall 2 (see FIG. 1, aspect vi).

Entirely embedding the electrically conductive element 1 in a planar dielectric layer can be performed, for instance, by entirely covering the electrically conductive layer 12 with a dielectric layer (e.g., SiO$_2$), then planarizing the dielectric layer by chemical mechanical polishing.

In a second aspect, the present disclosure relates to an electrode 3 obtainable by a method according to any embodiment of the first aspect. As an example, the electrode can comprise an electrically conductive element 1 surrounded by a wall 2 having a height that is smaller than 0.1038 times the length (or diameter) of the electrically conductive element 1. As another example, the electrode can comprise an electrically conductive element 1 surrounded by a wall 2 having a height that is smaller than 0.1000 times the length (or diameter) of the electrically conductive element 1. The wall height (h) is measured from a bottom surface of the electrically conductive element 1 to a top surface of the wall 2. The length (or diameter) is measured parallel to the top surface of the substrate 5.

Any feature of the second aspect can be independently, as correspondingly, described in the first aspect of the present disclosure.

Figure 11:
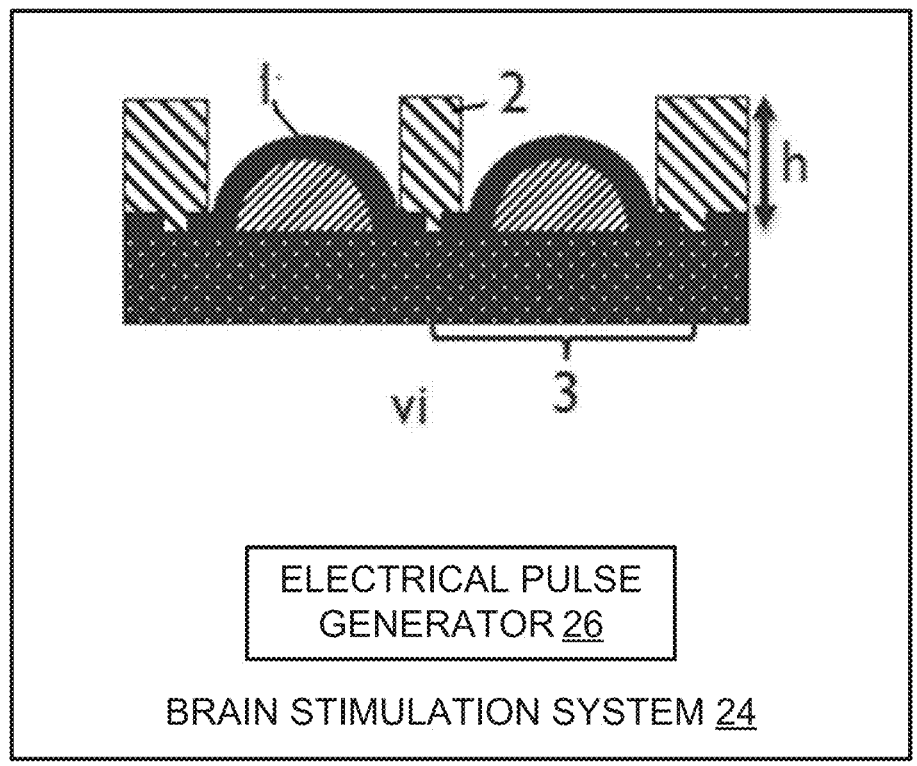
FIG. 11 shows a brain stimulation system in accordance with an aspect described in the description.

In a third aspect, the present disclosure relates to a brain stimulation system 24 shown in FIG. 11 comprising an electrode 3 according to any embodiment of the second aspect, and an electrical pulse generator 26 electrically coupled to the electrode 3.

Any feature of the third aspect can be independently, as correspondingly, described in the first or second aspect of the present disclosure.

In a fourth aspect, the present disclosure relates to an array of electrodes 3 according to any embodiment of the second aspect of the present disclosure.

In at least some embodiments, the array of electrode 3 can be for in vitro cell interfacing.

Any feature of the fourth aspect can be independently, as correspondingly, described in the first or second aspect of the present disclosure.

Figure 10:
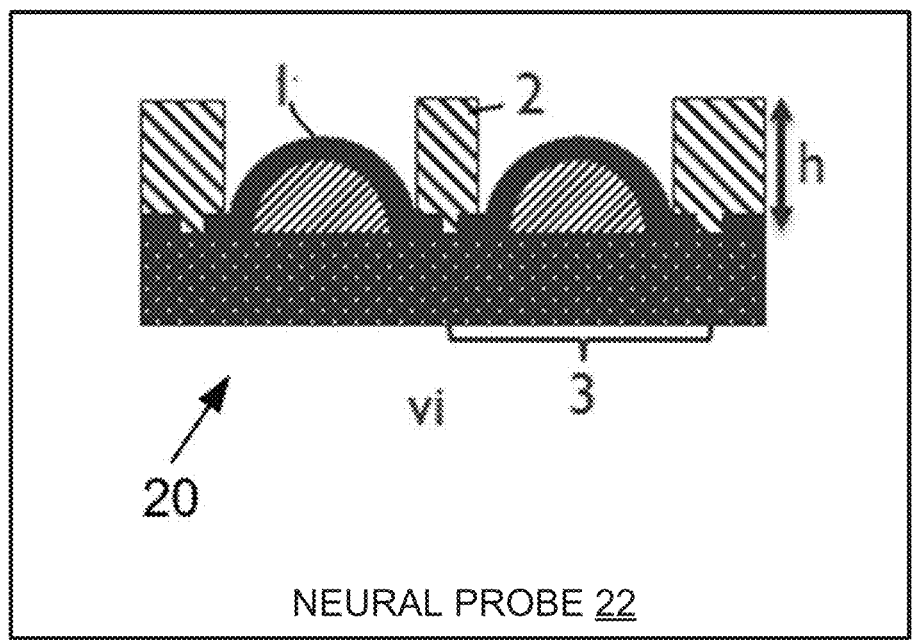
FIG. 10 shows a neural probe in accordance with an aspect described in the description.

In a fifth aspect, the present disclosure relates to a neural probe 22 shown in FIG. 10 comprising the electrode 3 according to the second aspect or the array of electrodes 3 according to any embodiment of the fourth aspect.

As used herein and unless provided otherwise, a neural probe is a device for implanting into the brain or other nervous tissues.

Any feature of the fifth aspect can be independently, as correspondingly, described in the first or second aspect of the present disclosure.

It is to be understood that although example embodiments, constructions and configurations, as well as materials, have been discussed herein for devices according to the present disclosure, various changes or modifications in form and detail can be made without departing from the scope of this disclosure. For example, any formulas given above are merely representative of procedures that can be used. Functionality can be added or deleted from the block diagrams and operations can be interchanged among functional blocks. Steps and/or functions can be added to and/or deleted from methods described within the scope of the present disclosure.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A method for manufacturing an electrode, the method comprising:
   providing, over a top surface of a substrate, a first electrically conductive element formed from one or more electrically conductive materials;
   measuring at least one parameter indicative of a shape or of dimensions of the first electrically conductive element;
   performing simulations of the first electrically conductive element and a dielectric wall surrounding the first electrically conductive element, wherein:
   the dielectric wall for each simulation has a respective wall height from among a plurality of wall heights, and
   each simulation is based on:
   the respective wall height from among the plurality of wall heights,
   the first electrically conductive element formed from one or more electrically conductive materials, and
   the at least one parameter;
   for each simulation and the respective wall height, computing a maximum current density present at a surface of the simulated first electrically conductive element;
   determining, based on the maximum current densities, one or more wall heights for which the maximum current density is below a predefined threshold; and
   providing a second electrically conductive element, identical to the first electrically conductive element, surrounded by a corresponding wall having a corresponding wall height of the one or more wall heights.

2. The method according to claim 1,
   wherein determining the one or more wall heights for which the maximum current density is below the predefined threshold comprises identifying among the one or more wall heights for which the maximum current density is below the predefined threshold, a specific wall height resulting in a lowest maximum current density, and
   wherein providing the second electrically conductive element comprises providing an electrically conductive element, identical to the first electrically conductive element, surrounded by a wall having a wall height closer to the specific wall height than to any other wall height among the one or more wall heights.

3. The method according to claim 2,
   wherein the electrode is for use in brain stimulation, and wherein the brain stimulation is a deep brain stimulation.

4. The method according to claim 1, wherein providing the second electrically conductive element, identical to the first electrically conductive element includes reusing the first electrically conductive element.

5. The method according to claim 1, wherein providing the second electrically conductive element, identical to the first electrically conductive element includes providing a new electrically conductive element other than the first electrically conductive element.

6. The method according to claim 1, wherein the first electrically conductive element has a length measured parallel to the top surface of the substrate which is larger than a height measured perpendicular to the top surface of the substrate.

7. The method according to claim 1, wherein the first electrically conductive element has a length measured parallel to the top surface of the substrate which measures from 5 µm to 200 µm or from 10 µm to 50 µm.

8. The method according to claim 1,
wherein the substrate comprises a shank, and
wherein a height of the shank is at least three times a width of the shank.

9. The method according to claim 1, wherein a top surface of the first electrically conductive element has a concave shape with a concavity facing the substrate.

10. The method according to claim 1, wherein the corresponding wall height of the corresponding wall surrounding the second electrically conductive element is measured from a bottom surface of the second electrically conductive element to a top surface of the corresponding wall and is smaller than 0.1038 times a length of the second electrically conductive element measured parallel to the top surface of the substrate.

11. The method according to claim 10, wherein the corresponding wall height of the corresponding wall surrounding the second electrically conductive element is smaller than 0.1000 times the length of the second electrically conductive element measured parallel to the top surface of the substrate.

12. The method according to claim 1, wherein the corresponding wall surrounding the second electrically conductive element has a wall height within 10% of a wall height minimizing maximum current density.

13. The method according to claim 1, wherein the corresponding wall is from 0.11 µm to 3 µm high.

14. The method according to claim 1, wherein a geometrical center of a top surface of the first electrically conductive element is higher than any edge of the top surface of the first electrically conductive element.

15. An electrode obtained by the method of claim 1, the electrode comprising:
the first electrically conductive element over the top surface of the substrate,
wherein the first electrically conductive element is surrounded by the dielectric wall which has a wall height smaller than 0.1038 times a length of the first electrically conductive element measured parallel to the top surface of the substrate, and
wherein the wall height of the dielectric wall is measured from a bottom surface of the first electrically conductive element to a top surface of the dielectric wall.

16. The electrode of claim 15, wherein the wall height of the dielectric wall surrounding the first electrically conductive element is smaller than 0.1000 times the length of the first electrically conductive element measured parallel to the top surface of the substrate.

17. An array of electrodes according to claim 15.

18. A neural probe comprising the array of electrodes according to claim 17.

19. A neural probe comprising the electrode according to claim 15.

20. A brain stimulation system, the system comprising:
the electrode according to claim 15; and
an electrical pulse generator electrically coupled to the electrode.

* * * * *